United States Patent
Dart

[11] 3,958,158
[45] May 18, 1976

[54] HEAD
[75] Inventor: Larry K. Dart, Costa Mesa, Calif.
[73] Assignee: International Telephone and Telegraph Corporation, New York, N.Y.
[22] Filed: Mar. 10, 1975
[21] Appl. No.: 556,845

[52] U.S. Cl............................. 317/141 S; 4/DIG. 3; 317/148.5 B
[51] Int. Cl.²..................................... E03D 13/100
[58] Field of Search................. 317/141 S, 148.5 B; 335/205; 4/DIG. 3

[56] References Cited
UNITED STATES PATENTS

| | | | |
|---|---|---|---|
| 3,590,397 | 7/1971 | Akumatsu et al. | 335/205 UX |
| 3,668,479 | 6/1972 | Weston et al. | 317/141 S |
| 3,718,839 | 2/1973 | Conti et al. | 317/148.5 B |

*Primary Examiner*—R. N. Envall, Jr.
*Attorney, Agent, or Firm*—A. Donald Stolzy

[57] ABSTRACT

A control circuit for the motor of an electric marine toilet which, effectively, causes the toilet to flush. A conventional D.C. source of potential is employed with a conventional marine toilet including a motor, a pump driven by the motor and a macerator driven by the motor. The lid of the toilet operates a normally open switch. An advantage of the invention is that the lid-operated switch prevents injury to the operator. Moreover, the lid-operated switch provides a motor control override. That is, the motor can be turned off whenever the lid is lifted. A control circuit is provided between the source and the motor to control the motor, the lid operating, for example, by a magnet, a reed switch in the control circuit. The flush cycle may extend over any period. However, a three-second flush cycle is typical. The control circuit includes a momentary contact push button to operate the motor for a three-second interval timed by the control circuit. If the push button is held down for more than three seconds, there is a timing override which causes a flushing action that continues indefinitely until the push button is no longer held down. The structure disclosed has several advantages, one of which is that it is not, in the hazardous location on board a small boat, subject to breakage or corrosion. Further, its useful life far exceeds prior control devices for timing the flush cycle of an electric marine toilet. The structure disclosed also operates within small timing tolerances, and the timing thereof is independent of the D.C. input voltage magnitude impressed thereupon. Still further, the control circuit disclosed has an extremely small leakage current and power loss when the push button is not depressed. For example, the total leakage current may be 50 microamperes through a silicon controlled rectifier T1C45. This current may cause a power loss through a relay coil, the said silicon controlled rectifier and a resistor, all being connected in series, where the resistor may have a resistance of 0 ohms, 40 ohms or 75 ohms. If the lid is raised, there is no leakage current and there is no power loss. The timing is accomplished by applying a negative spike at an appropriate instant in time to the anode of the silicon controlled rectifier.

6 Claims, 2 Drawing Figures

HEAD

BACKGROUND OF THE INVENTION

This invention relates to pleasure boat and other similar equipment, and more particularly to an electric marine toilet, and a flush control circuit therefor.

In the past, mechanical timers have been employed for various purposes. Such timers wear out and are subject to breakage and to corrosion.

Thermal timers have been employed for various purposes in the prior art. However, these timers operate within very large timing tolerances.

Electric marine toilets are generally not provided with any macerator protection, or any override switch for the motor wich drives a pump and the macerator.

Prior art assemblies also have not been provided with anything to override flush timing.

Still further, no electrical device has yet been devised to cause flush timing to be independent of input voltage magnitude.

Electrical timing devices have also been subject to the loss of substantial current and power during down time.

SUMMARY OF THE INVENTION

In accordance with the assembly and flush control circuit of the present invention employed for an electric marine toilet, the circuit is provided with a component which, when pulsed, causes the toilet to cease flushing.

In accordance with the present invention, a solid state circuit is employed which generally will not wear out from a mechanical or other standpoint, and is not subject to breakage or corrosion during ordinary sea use.

The assembly and flush control circuit of the present invention also incorporate a timer which has a very small timing tolerance.

The circuit of the present invention also has a flush cycle which is constant and independent of the input voltage magnitude.

Still further, the circuit of the present invention has a low loss or no loss down time characteristic in terms of both current and power.

The above-described and other advantages of the present invention will be better understood from the following detailed description when considered in connection with the accompanying drawings.

DESCRIPTION OF THE PREFERRED EMBODIMENT

Figure 1:
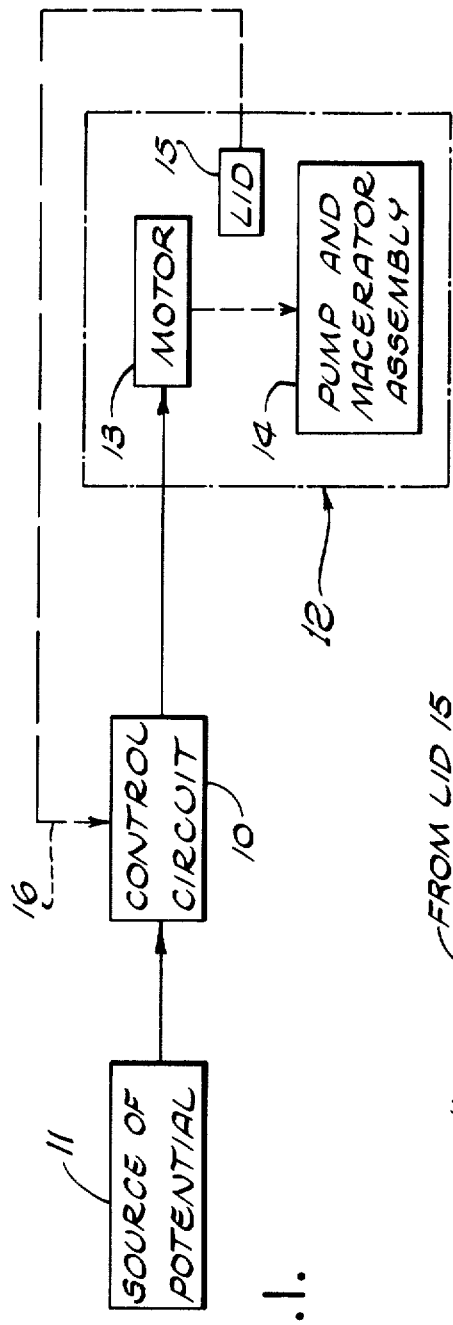
FIG. 1 is a block diagram of an electric marine toilet constructed in accordance with the present invention.

In FIG. 1, a flush control circuit 10 is shown which is constructed in accordance with the present invention. The circuit 10 is connected from a D.C. source of potential 11 to an electric marine toilet 12. Toilet 12 includes a motor 13 and a pump and macerator assembly 14. Toilet 12 also has a lid 15 which is connected at 16 to control circuit 10 for the purpose of operating a reed switch,, to be described.

As stated previously, circuit 10 is connected from source of potential 11. Motor 13 is connected from circuit 10. Assembly 14 is connected from motor 13.

Figure 2:
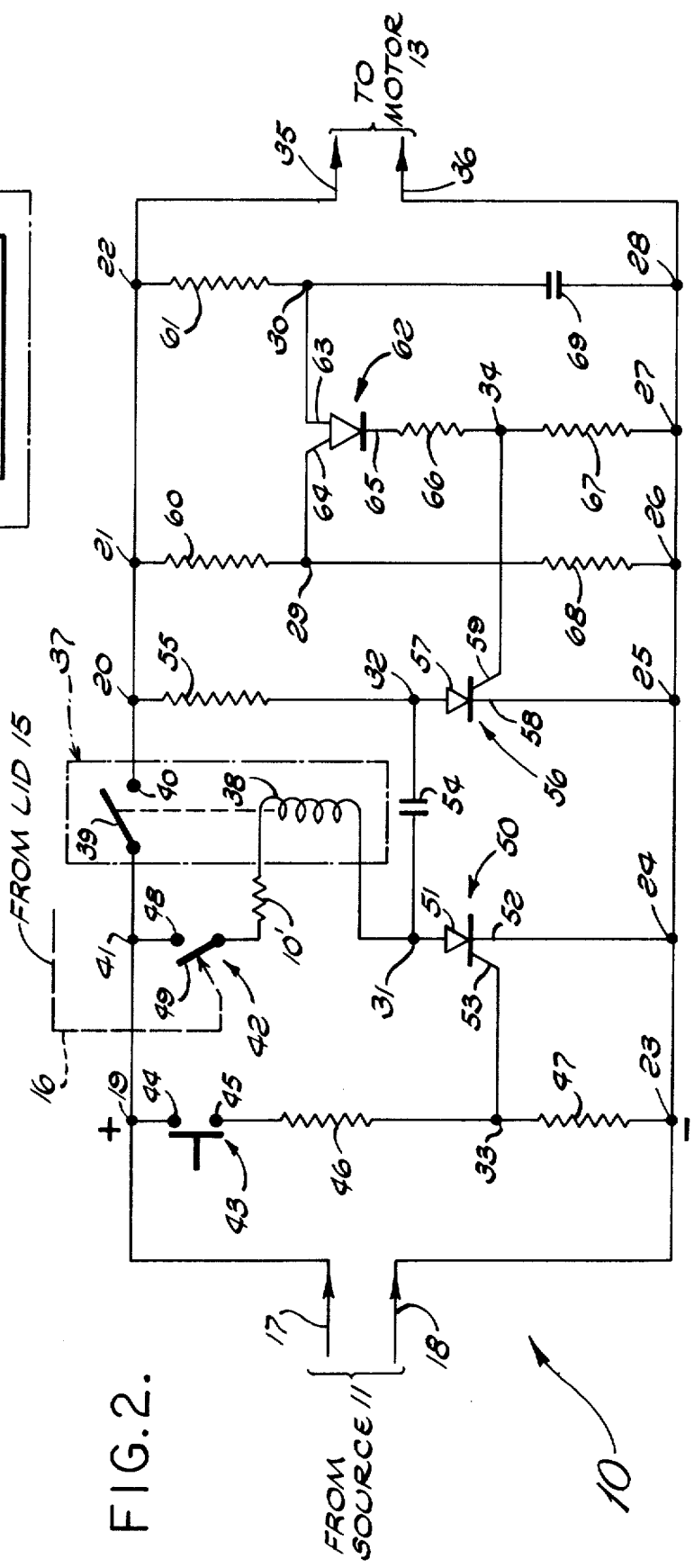
FIG. 2 is a schematic diagram of a flush control circuit shown in FIG. 1.

FIG. 2 is a schematic diagram of circuit 10. In FIG. 2, circuit 10 has input leads 17 and 18 connected from source 11. Circuit 10 has various junctions 19, 20, 21, 22, 23, 24, 25, 26, 27, 28, 29, 30, 31, 32, 33 and 34. Output leads 35 and 36 are connected respectively from junctions 22 and 28 to motor 13 shown in FIG. 1.

Circuit 10 includes a relay 37 having a winding 38, a pole 39 and a contact 40.

Another junction is provided at 41. Relay pole 39 is connected from junction 41. The reed switch is shown at 42. Reed switch 42 may be entirely conventional. The same is true of source 11 and toilet 12. However, the connection 16 from lid 15 is new. When reed switch 42 is open, as shown, winding 38 cannot energize, and pole 39 does not engage contact 40. In other words, the contacts of relay 37 are open. Junctions 41 and 20 are therefore disconnected. Junctions 20, 21 and 22 are all connected to output lead 35 from contact 40.

Junctions 19 and 41 are both connected from input lead 17 to pole 39.

All of the junctions 23 to 28 are connected together and are connected to input lead 18, and to output lead 36.

Flushing of toilet 12 is initiated by momentarily depressing a momentary contact button 43 which electrically connects terminals 44 and 45, terminals 44 and 45 normally being disconnected because the button of switch 43 is normally spring biased away from both terminals 44 and 45. Switch 43 may be entirely conventional. Although the circuit 10 is new, and the connection 16 thereto is new, each individual component of the circuit 10 is old in the art. A resistor 46 is connected from terminal 45 to junction 23. Resistor 47 is connected between junctions 33 and 23. Terminal 44 is connected to junction 19.

Reed switch 42 includes a contact 48 connected from junction 41 and a pole 49 for engagement with contact 48. Pole 49 engages contact 48 when lid 15 is closed.

Relay winding 38 is connected from pole 49 to junction 31. A silicon controlled rectifier is provided at 50 having an anode 51 connected from junction 31, a cathode 52 connected to junction 24 and a gate 53 connected to junction 33. A capacitor 54 is connected between junctions 31 and 32. A resistor 55 is connected between junctions 20 and 32. A second silicon controlled rectifier 56 is also provided having an anode 57 connected from junction 32, a cathode 58 connected to junction 25, and a gate 59 connected to junction 34. A resistor 60 is connected between junctions 21 and 29. A resistor 61 is connected between junctions 22 and 30. A programmable unijunction transistor (PUT) 62 is also provided having anode 63 connected from junction 30, a gate 64 connected from junction 29 and a cathode 65. A resistor 66 is connected from cathode 65 to junction 34. A resistor 67 is connected between junctions 34 and 27. A resistor 68 is connected between junctions 29 and 26. A capacitor 69 is connected between junctions 30 and 28.

OPERATION

The present invention may be employed to vary or to set a three-second flush cycle of the toilet 12. Reed switch 42, as a portion of the circuit 10, is utilized to disable the system whenever the lid 15 is open. This prevents possible injury to the operator by the macerator.

A magnet, not shown, is attached to the lid 15. The reed switch 42 is attached to the upper inside of the toilet base in a manner such that when the lid 15 is closed, the magnet lies close to the reed switch 42 so as to cause it to close. With the reed switch 42 closed, power is supplied to relay winding 38, and the assembly of FIG. 1 is ready for operation.

When the push button of switch 43 is depressed, circuit 10 pulls in the relay 37, causes pole 39 to engage contact 40 and provides power to the motor 13 shown in FIG. 1. After a preset time interval, e.g. three seconds, the current through relay winding 38 is cut off. This causes pole 39 to disengage contact 40. Such disengagement, in turn, turns off motor 13.

The circuit 10 provides for an override of the timing function in that the push button of switch 43 may be held down continuously. At any time during the cycle, the motor 13 may be turned off by lifting the lid 15. The reed switch 42 will then open.

The construction of circuit 10 is, in part, determined by selecting a silicon controlled rectifier 50 which will perform the switching of the current through relay winding 38. In this case, if desired, silicon controlled rectifier 50 may be of the T1C45 type.

Relay winding 38 is connected from pole 49 through a resistor 10'. Resistor 10' is varied in size from application to application to allow for usage with various voltages. These voltages may be, for example, 12 volts, 24 volts or 32 volts. In the case of 12 volts, the resistance of resistor 10' may be 0 ohms. For 24 volts, a 40-ohm resistor may be used at 10'. For 32 volts, a 75-ohm resistor may be used at 10'. In any of these cases, the resistance of resistor 10' may be selected in a manner such that relay winding 38 will have a maximum of 12 volts only applied across it at any one time.

To turn on the motor 13, switch 43 is closed. This allows current to flow through resistors 46 and 47. Resistors 46 and 47 form a voltage divider. Resistors 46 and 47 preferably should have respective resistances of magnitudes appropriate to allow enough current to flow and for a voltage to build up at junction 33 sufficient to insure that silicon controlled rectifier (SCR) 50 will turn on.

SCR 50 will remain in conduction until either source 11 is disconnected from input leads 17 or 18 to circuit 10 in FIG. 2, or a negative spike is produced that is transferred from junction 32 to junction 31 via capacitor 54. This negative spike is produced by discharging capacitor 54 through SCR 56. Capacitor 54 is allowed to charge through resistor 55 while SCR 50 is on and SCR 56 is off.

SCR 56 is turned on when the remainder of the circuit times out.

As soon as capacitor 69 charges up to the bias voltage on anode 63, an output pulse turns on SCR 56 which, in turn,, turns off SCR 50. When SCR 50 turns off, relay winding 38 is deenergized, and pole 39 disengages contact 40.

If switch 43 is held down continuously, SCR 50 cannot be turned off.

Among the other advantages of the present invention shown in FIGS. 1 and 2, it is to be noted that the flush time interval is constant and independent of the magnitude of the output voltage of source 11. This is true because the same voltage appears between junctions 21 and 26 as appears between junctions 22 and 28. Thus, junctions 29 and 30, independent of other variations, vary in the same manner with the magnitude of the output voltage of source 11, and the timing interval provided does not vary because of the voltage variations at junctions 29 and 30 due strictly to input voltage variations.

As is conventional, PUT 62 fires when junction 30 rises in potential to a sufficient extent, i.e. at a point when the charge of capacitor 69 is sufficiently large.

Resistors 60 and 68 act as a voltage divider. Resistor 61 and capacitor 69 act as a resistance-capacitance charging circuit which may start from 0 volts at input lead 18, and rise upwardly to the firing point of PUT 62. In this case, SCR 56 fires because of the connection of gate 59 from junction 34. Capacitor 54 is then immediately discharged, providing a negative spike at the anode 51 of SCR 50.

If the resistance of resistor 10' is equal to 0 ohms, the maximum current through the relay winding 38 will be 50 microamperes. Thus, even with the switch 42 closed, the down time operating loss of the circuit 10 is very, very small.

Some typical circuit values including those already given are as follows:

| | |
|---|---|
| Capacitor 54 | 0.47 microfarads, 100 volts |
| Capacitor 69 | 4.7 microfarads, 35 volts |
| Resistor 10' | 0, 40 or 75 ohms for 12, 24 or 32 volts, respectively |
| Resistor 46 | 10,000 ohms |
| Resistor 47 | 1,000 ohms |
| Resistor 55 | 30,000 ohms |
| Resistor 60 | 33,000 ohms |
| Resistor 61 | 680,000 ohms |
| Resistor 66 | 2,700 ohms |
| Resistor 67 | 1,000 ohms |
| Resistor 68 | 68,000 ohms |
| SCR 50 | T1C45 |
| SCR 56 | T1C45 |
| PUT 62 | 2N6027 |

What is claimed is:

1. A control circuit comprising: a source of potential; a utilization device; first and second input leads connected from said source; a relay having a winding, a pole and a contact; first and second output leads connected to said utilization device, said second leads being connected together, said relay pole and contact being connected in series between said first leads; a first silicon controlled rectifier (SCR) having an anode, a cathode and a gate, said first SCR cathode being connected to said second leads, said relay winding being connectible from said first SCR anode to said first input lead; first means connected between said input leads for supplying a voltage and current to said first SCR gate at a predetermined time to cause said first SCR to fire, to cause said relay winding to be energized and to cause said relay pole to engage said relay contact; and second means connected between said output leads for supplying a potential to said first SCR anode at least momentarily the same as that on said second leads in a manner to cut off said first SCR, to deenergize said relay winding and to cause disengagement of said relay pole from said relay contact at a time later than said predetermined time.

2. The invention as defined in claim 1, wherein said first means includes a first series circuit connected between said first and second input leads, said first series circuit including a momentary contact switch, a first resistor, a junction and a second resistor, said first SCR gate being connected to said junction, said junction being connected between said first and second resistors, said momentary contact switch being connected in said first series circuit between said first junction and said first input lead.

3. The invention as defined in claim 2, wherein said second means includes first and second capacitors, first, second, third, fourth, fifth and sixth resistors, a second SCR, a second junction and a unijunction transistor (PUT), said second SCR having an anode, a cathode and a gate, said PUT having an anode, a gate and a cathode, said first capacitor being connected between the anodes of said first and second SCR's, said first resistor being connected from said first output lead to said second SCR anode, said SCR cathode being connected to said second output lead, said second resistor being connected from said first output lead to said PUT gate, said fifth resistor being connected from said PUT gate to said second output lead, said third resistor being connected from said first output lead to said first base, said second capacitor being connected from said PUT anode to said output lead, said PUT cathode, said forth resistor and said sixth resistor being connected in succession in that order from said PUT anode and said PUT gate to said second output lead, said second SCR gate being connected between said fourth and sixth resistors.

4. A waste disposal system, said system comprising: a source of potential; a mobile toilet having a bowl, a lid for said bowl, an assembly to force comminuted sewage out of said bowl, and a motor to drive said assembly; a source of potential; first and second input leads connected from said source; a relay having a winding, a pole and a contact; first and second output leads connected to said motor, said second leads being connected together, said relay pole and contact being connected in series between said first leads; a firsr silicon controlled rectifier (SCR) having an anode, a cathode and a gate, said first SCR cathode being connected to said second leads; an auxiliary switch, said relay winding being connected in series with said auxiliary switch from said first SCR anode to said first lead; first means connected between said input leads for supplying a voltage and current to said first SCR gate at a predetermined time to cause said first SCR to fire, to cause said relay winding to be energized and to cause said relay pole to engage said relay contact; and second means connected between said output leads for supplying a potential to said first SCR anode at least momentarily the same as that on said second leads in a manner to cut off said first SCR, to deenergize said relay winding and to cause disengagement of said relay pole from said relay contact at a time later than said predetermined time, said auxiliary switch being normally open and closed by closure of said lid.

5. The invention as defined in claim 4, wherein said first means includes a first series circuit connected between said first and second input leads, said first series circuit including a momentary contact switch, a first resistor, a junction and a second resistor, said first SCR gate being connected to said junction, said junction being connected between said first and second resistors, said momentary contact switch being connected in said first series circuit between said first junction and first input lead.

6. The invention as defined in claim 5, wherein said second means includes first and second capacitors, first, second, third, fourth, fifth and sixth resistors, a second SCR, a programmable unijunction transistor (PUT), said second SCR having an anode, a cathode and a gate, said PUT having an anode, a gate and a cathode, said first capacitor being connected between the anodes of said first and second SCR's, said first resistor being connected from said first output lead to said second SCR anode, said SCR cathode being connected to said second output lead, said second resistor being connected from said first output lead to said PUT anode, said fifth resistor being connected from said PUT gate to said second output lead, said third resistor being connected from said first output lead to said PUT anode, said second capacitor being connected from said PUT anode to said second output lead, said emitter, said fourth resistor and said sixth resistor being connected in succession in that order from said PUT anode and said PUT gate to said second output lead, said second SCR gate being connected between said fourth and sixth resistors.

* * * * *